(12) United States Patent
Schneider et al.

(10) Patent No.: US 7,955,641 B2
(45) Date of Patent: Jun. 7, 2011

(54) METHOD OF MAKING A PIEZOELECTRIC DEVICE

(75) Inventors: John K. Schneider, Snyder, NY (US); Jack C. Kitchens, Tonawanda, NY (US)

(73) Assignee: Ultra-Scan Corporation, Amherst, NY (US)

( * ) Notice: Subject to any disclaimer, the term of this patent is extended or adjusted under 35 U.S.C. 154(b) by 122 days.

(21) Appl. No.: 12/191,079

(22) Filed: Aug. 13, 2008

(65) Prior Publication Data

US 2009/0047445 A1    Feb. 19, 2009

Related U.S. Application Data

(60) Provisional application No. 60/955,472, filed on Aug. 13, 2007.

(51) Int. Cl.
  *B05D 5/12* (2006.01)
  *H01L 41/22* (2006.01)
  *H05H 1/00* (2006.01)

(52) U.S. Cl. ............... 427/100; 29/25.35; 427/537

(58) Field of Classification Search .......... 427/100, 427/537; 29/25.35
See application file for complete search history.

(56) References Cited

U.S. PATENT DOCUMENTS

| | | | | |
|---|---|---|---|---|
| 5,423,285 A | * | 6/1995 | Paz de Araujo et al. | 117/90 |
| 5,619,480 A | * | 4/1997 | Seo et al. | 369/14 |
| 5,702,629 A | * | 12/1997 | Cui et al. | 252/62.9 R |
| 6,140,746 A | * | 10/2000 | Miyashita et al. | 310/358 |

OTHER PUBLICATIONS

Schwartz "Chemical Solution Deposition of Perovskite Thin Films", Chemical materials, 1997, vol. 9, p. 2325-2340.*
Yi et al. "An Acetic Acid/Water Based Sol-Gel PZT Process I: Modification of Zr and Ti Alkoxides with Acetic Acid", Journal of Sol-Gel Science and Technology, 1996, vol. 6, pp. 65-74.*
International Search Report and Written Opinion for PCT/US2008/073041, Nov. 7, 2008, Ultra-Scan Corporation.
Schwartz; Chemical Solution Deposition of Perovskite Thin Films; Chem. Mater., 1997, vol. 9; pp. 2325-2340.
Yi, et al.; An Acetic Acid/Water Based Sol-Gel PZT Process I: Modification of Zr and Ti Alkoxides with Acetic Acid; Journal of Sol-Gel Science and Technology, 1996, vol. 6; pp. 65-74.

* cited by examiner

*Primary Examiner* — Brian K Talbot
(74) *Attorney, Agent, or Firm* — Hodgson Russ LLP

(57) ABSTRACT

A method of forming a piezoelectric device is disclosed. In one such method, a coating material is formed. The coating material has a piezoelectric precursor. The coating material is applied to a first electrode. The precursor is heated to a temperature that is above the Curie temperature of the precursor, but below the melting temperature of the precursor. While the precursor is above its Curie temperature, a voltage is applied across the precursor. While the voltage is applied across the precursor, the temperature of the precursor is reduced to below the Curie temperature.

22 Claims, 3 Drawing Sheets

METHOD OF MAKING A PIEZOELECTRIC DEVICE

CROSS-REFERENCE TO RELATED APPLICATION

This application claims the benefit of priority to U.S. provisional patent application Ser. No. 60/955,472, filed on Aug. 13, 2007.

FIELD OF THE INVENTION

The invention relates to piezoelectric devices.

BACKGROUND OF THE INVENTION

In the field of electronics, certain electrical components can be formed by using techniques which were once employed only in printing ink on paper. For example, it is now possible to use an ink-jet printer to apply conductive and insulating materials to a substrate and thereby form certain electronic devices. For example, transistors (including field effect transistors), diodes (including light emitting diodes), capacitors and a number of other electronic devices can be formed quickly and cheaply. Furthermore, these devices can be formed on rigid and flexible substrates.

Such techniques have not been used to produce piezoelectric devices. Consequently, when a piezoelectric device is desired, circuit manufacturers are left with choices that are expensive and often only available in forms that involve extensive pre-processing and waste. Therefore, it would be useful to be able to employ so called "printing" techniques to create a piezoelectric device.

SUMMARY OF THE INVENTION

The invention may be used to form a piezoelectric device. In one such method, a coating material is created, which can be applied via a pen, ink jet printer, or screening methods. The coating material may include a precursor material that can be rendered to have piezoelectric properties. For example, the precursor material may be subjected to heat and a voltage in order to alter the structure of the precursor in order to form a piezoelectric material.

The coating material can be applied over a first electrode, and allowed to dry on the first electrode in order to leave the precursor material on the first electrode. The precursor material may be heated to above its Curie temperature, but below its melting temperature, and a voltage may be applied across the precursor material. In this manner, crystals may be formed from the precursor material and those crystals may be oriented ("poled") by the applied voltage. The voltage may be applied using the first electrode. While the voltage is applied, the temperature may be reduced to below the Curie temperature, thereby leaving a piezoelectric material on the first electrode. Once below the Curie temperature, and preferably below 50 C., the voltage may be removed.

A second electrode may be applied. The second electrode may be applied to the precursor material prior to heating above the Curie temperature. Alternatively, the second electrode may be applied after the precursor material has been modified by heat and voltage to produce the piezoelectric material.

The resulting piezoelectric device may be used as a transducer for a sensor or actuator, and may be part of a phased array, linear array, or annular imaging array.

BRIEF DESCRIPTION OF THE DRAWINGS

For a fuller understanding of the nature and objects of the invention, reference should be made to the accompanying drawings and the subsequent description. Briefly, the drawings are.

FURTHER DESCRIPTION OF THE INVENTION

Figure 1:
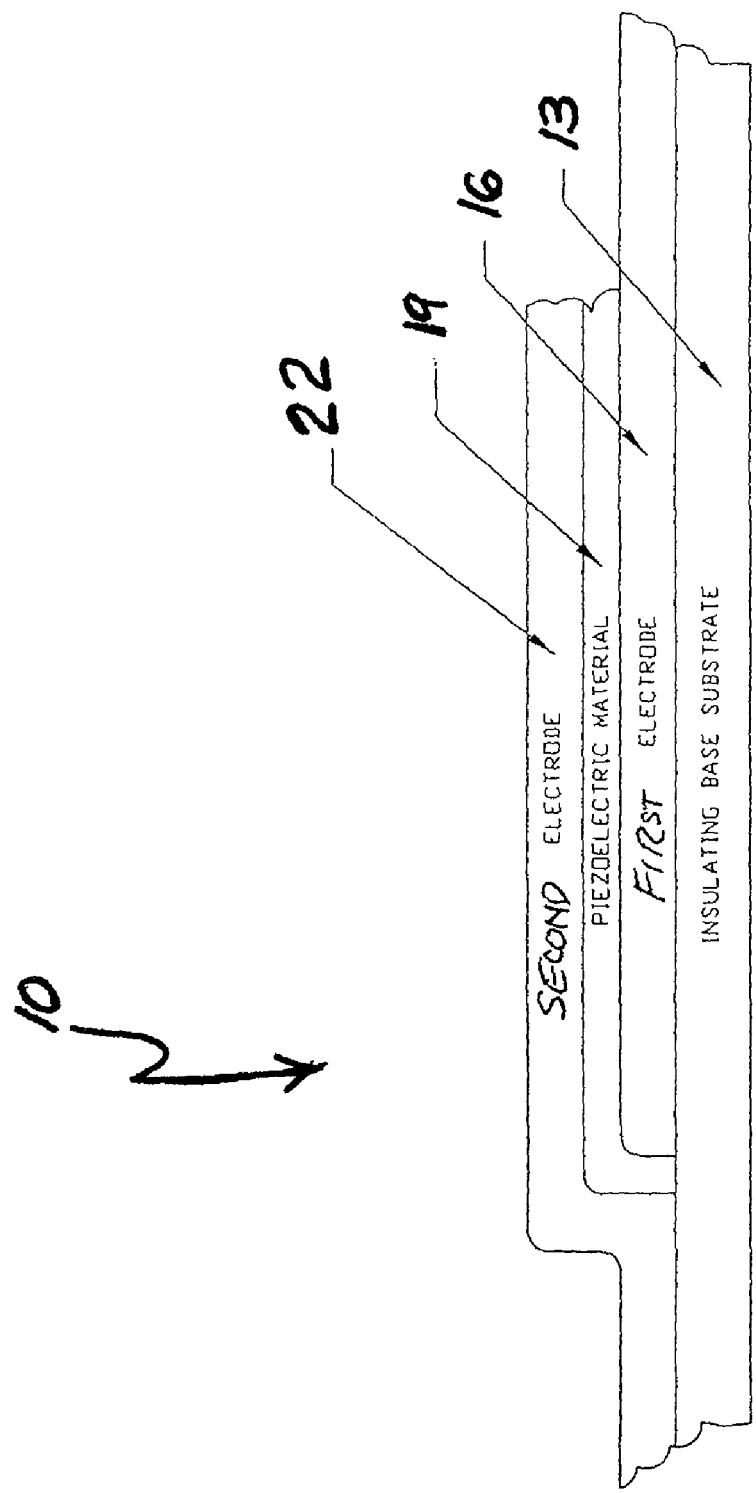
FIG. 1 is a schematic of a device that was manufactured according to a method that is in keeping with the invention.

FIG. 1 depicts a device 10 that has been made according to a method that is in keeping with the invention. In FIG. 1 there is depicted a substrate 13, a first electrode 16, a piezoelectric material 19 and a second electrode 22. Generally speaking, the device depicted in FIG. 1 may be created by forming the first electrode 16 on the substrate 13, applying a coating material to the first electrode 16 and subjecting at least some of the components of the coating material to conditions that will impart piezoelectric properties to those components. The second electrode 22 may be applied prior to those piezoelectric-forming conditions, or may be formed after those piezoelectric-forming conditions.

Figure 2:
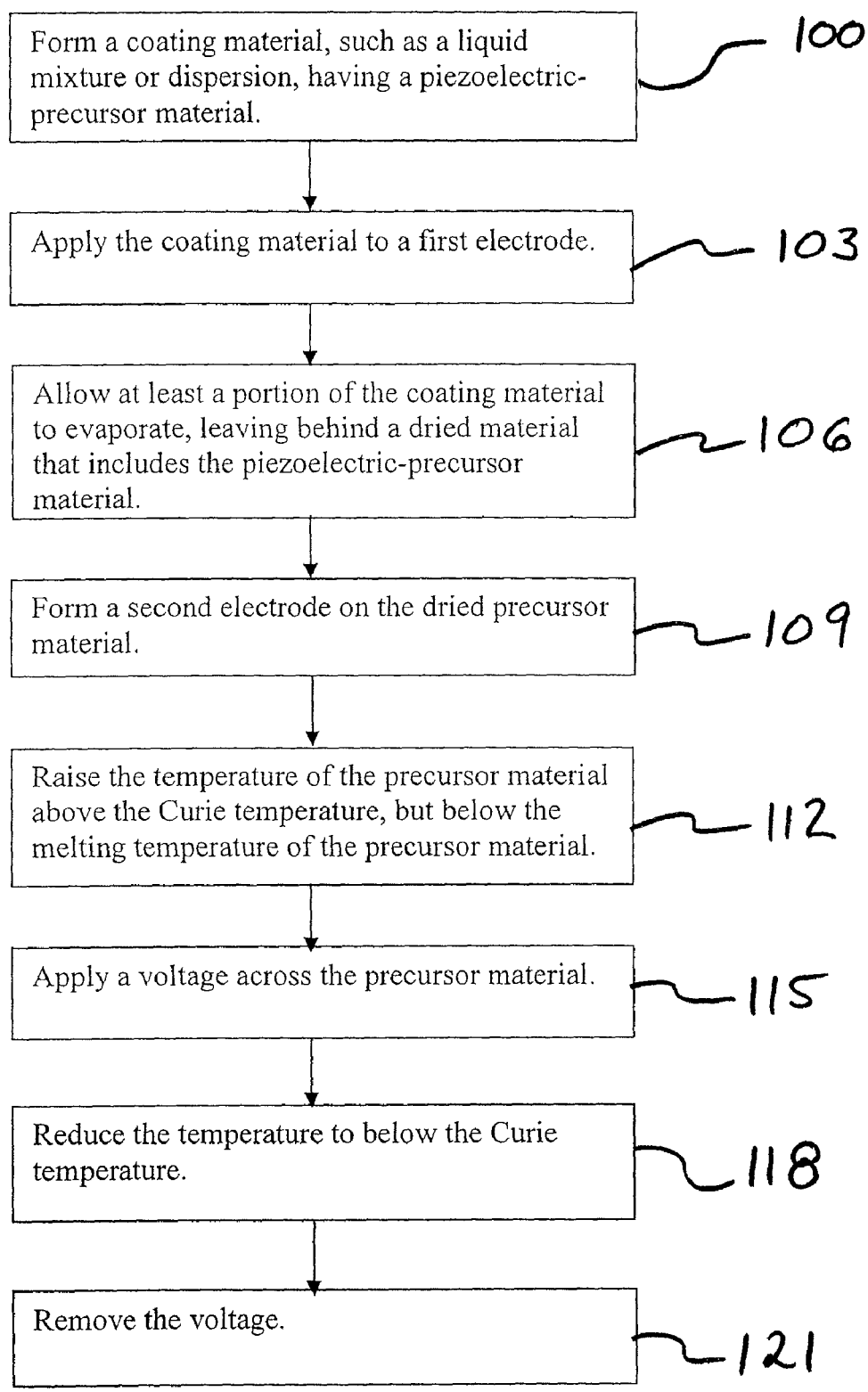
FIG. 2 is a flow diagram depicting a method that is in keeping with the invention.

FIG. 2 depicts a method according to the invention in which the second electrode 22 is formed prior to creating the piezoelectric-forming conditions. In such a method, a substrate 13 may be provided. The substrate 13 may be an insulating material such as glass, ceramic, or a synthetic plastic resin such as PMMA, polycarbonate, or polystyrene. A first electrode 16 may be applied to the substrate 13, for example, by spraying a conductive material, such as silver, nickel, graphite, carbon or gold, onto a portion of the substrate 13. The conductive material may be sprayed by an ink-jet printer. Screening methods, such as that commonly referred to as "silk screening", may also be used to apply the first electrode 16 to the substrate 13.

Alternatively, the conductive material may be applied to the substrate 13 by a pen, which dispenses the conductive material in lieu of ink. Such a pen may be a ball-point pen, a felt-tipped pen or a micro-pen. A micropen has a small-diameter hollow tube with a reservoir that may be used to meter out the conductive material at a controlled rate. Such a micropen allows the conductive material to be applied to a thickness that is usually within a micron of the desired thickness.

To the first electrode 16 may be applied 103 a layer of coating material, which may be formed 100 from a carrier material, such as a liquid, and a piezoelectric-precursor material. The piezoelectric-precursor material, may be a polymer material such as PVDF (polyvinylidene fluoride), a co-polymer material such as PVDF-TrFE (polyvinylidene fluoride trifluoroethylene), or a ceramic such as lead-zirconium-titanate ("LZT"). The coating material may be applied 103 using an ink-jet printer, pen, or silk-screening devices. Such devices are described above. It should be noted that depending on the device used to apply 103 the coating material, the viscosity of the coating material may be selected in order to facilitate application of the coating material. By selecting a desired viscosity of the coating material, the application device (e.g. ink jet printer, pen or screen) may be allowed to function efficiently. Further, the viscosity may be selected to a desired viscosity so that when the coating material is applied to the first electrode 16, the coating material remains on the first electrode 16 while processing of the precursor material occurs. For example, the viscosity of the coating material may be selected to be between 2200 and 2400 centipoise.

In order to facilitate application 103 of the coating material, the coating material may include not only the piezoelectric precursor material, but also a carrier material, such as a liquid. For example, when the precursor material is PVDF or PVDF-TrFE, the carrier material may be a ketone solvent such as methyl-ethyl-ketone. When the precursor material is LZT, the LZT may be dispersed in a liquid carrier material such as water or an acrylic/water solution to form a slurry. Appropriate stabilizers, surfactants and dispersing agents may be included in order that the precursor material remains dissolved in the solution or dispersed in the dispersion, as the case may be.

Other compounds may be present in the coating material. For example, an adhesion promoting agent, such as acrylic resin, phenolic resin or other agents, may be added to the coating material in order to promote adhesion to one or both of the electrodes 16, 22. Furthermore, color bodies (e.g. a dye or pigment) may be added in order to aid in seeing where the coating material is applied.

Once the coating material is applied 103 to the first electrode 16, the carrier material may be allowed to evaporate 106, thereby leaving behind the precursor material. Such a drying process may be undertaken at an elevated temperature in order to speed evaporation 106 of the carrier material. In some situations, it may be beneficial to subject the coating material to temperatures akin to firing pottery in order to coalesce the precursor material, and thereby fix it more firmly to the first electrode 16.

In an embodiment of the invention, a second electrode 22 may be formed 106 on the precursor material. The second electrode 22 may be applied by spraying a conductive material, such as silver, nickel, graphite, carbon or gold. For example, the conductive material may be sprayed by an ink-jet printer. Alternatively, the conductive material may be applied to the precursor material by a pen, which dispenses the conductive material in lieu of ink. Screening processes may also be used. It will now be apparent that the electrodes and precursor material may be formed so that the precursor material is sandwiched between the electrodes.

Once the electrodes 16, 22 and precursor material are in place, they may be heated to a temperature above the Curie temperature of the precursor material, but below the melting point of the precursor material, to allow for crystal growth. For example, to raise the temperature 112 of the precursor material, the substrate 13, electrodes 16, 22 and precursor material may be placed in an oven and heated. In the case where the precursor material is PVDF-TrFE copolymer, the Curie temperature is 106 C. and the melting temperature is 149 C. Between these temperatures, polar crystals having a single electrostatic domain can be formed. For example, given approximately three hours at 135 C., PVDF-TrFE will form crystals having a single electrostatic domain, which is desired for achieving the piezoelectric qualities sought by this invention. We have learned that at 115 C., 12 hours may be needed to form the crystals, and at 125 C., six hours may be needed to form the crystals. Once such crystals are formed, the crystals may be similarly oriented by applying 115 a voltage across the precursor material. Such "polling" of the crystals may be accomplished at a temperature that is above the Curie temperature, but below the melting temperature. However, it is possible to "pole" the crystals at temperatures below the Curie temperature, but more time may be required.

The voltage may be applied 115 across the precursor material via the electrodes 16, 22. Typically, the applied voltage will be 1000 volts or more. In the instance where the precursor material is PVDF-TrFE, the applied voltage might be 1000 to 1500 volts. The polling voltage should be selected to be below the dielectric breakdown voltage of the precursor material.

Figure 3:
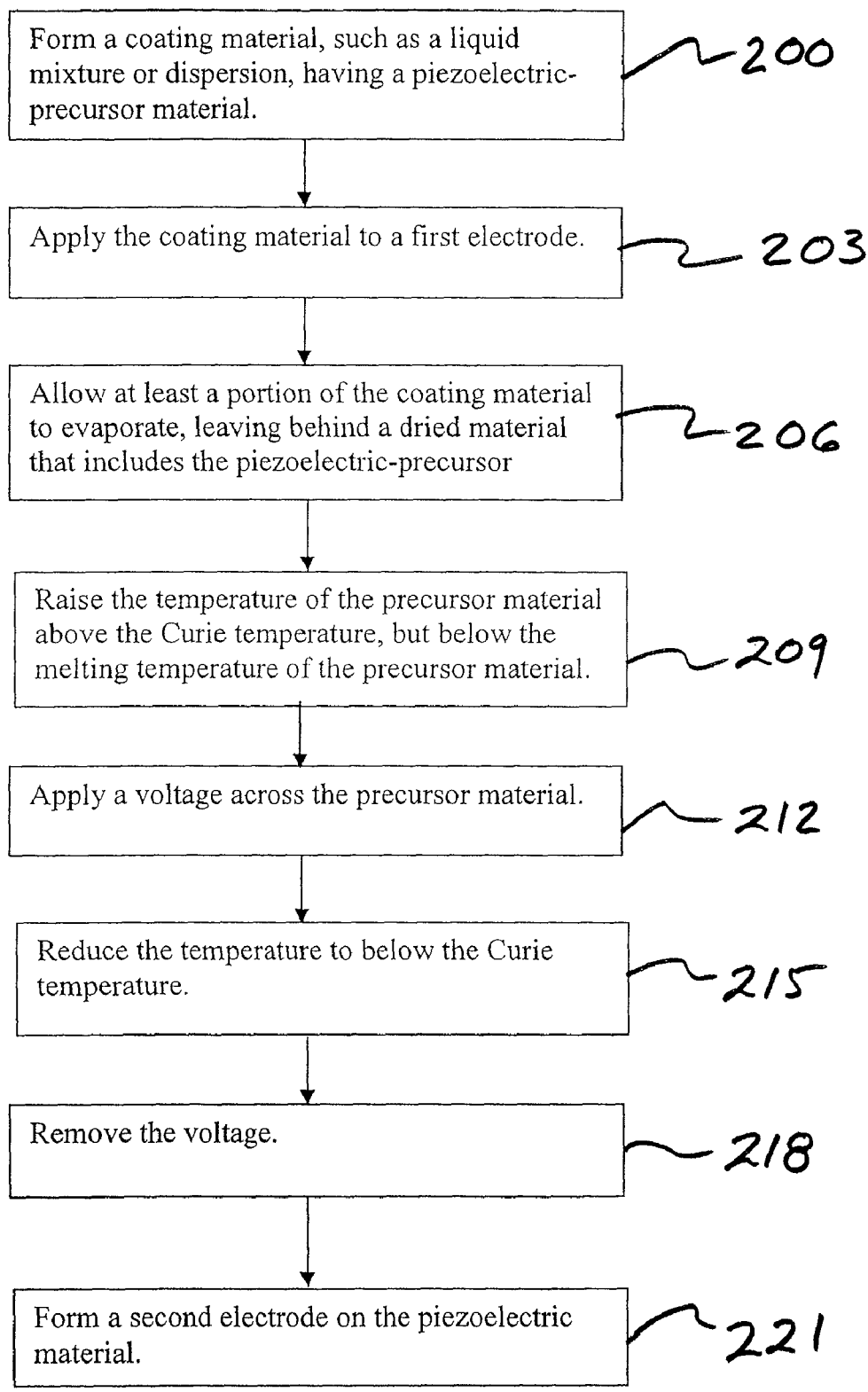
FIG. 3 is a flow diagram depicting a method that is in keeping with the invention.

Applying 115 the voltage in order to orient the crystals, which are formed by holding the temperature of the precursor material between the Curie temperature and below the melting temperature, can also be done by applying a corona field. Although such a corona field may be established after the second electrode 22 is formed, such a corona field may be applied prior to applying the second electrode 22. FIG. 3 depicts a method in which the corona field is applied prior to forming the second electrode 22. In FIG. 3, it will be noted that the coating material is formed 200 and applied 203 to the first electrode 16. The coating material may be applied 203 by ink-jet printer, pen or screen. Some of the coating material may be evaporated 206. Then the temperature of the precursor material is raised 112 to above the Curie temperature, but below the melting temperature, in order to allow for crystal growth. While in this temperature range, the corona field is established 212 between an external electrode (usually a wire or a needle point) and the first electrode 16 in order to subject the crystals to an electrostatic field and thereby orient the crystals. The temperature may be reduced 215 to below the Curie temperature, and preferably to below 50 C., before the corona field is removed 218. It is believed that when polling is carried out using both electrodes, small holes in the precursor material create shorts, which detrimentally impact the ability to orient the crystals. By polling in a corona field prior to application of the second electrode, the detrimental effect of such holes is minimized. After the temperature has been reduced, the second electrode may be formed 221 on the piezoelectric material. The second electrode 22 may be formed by ink-jet printer, pen or screen.

The piezoelectric element formed from using the methods described herein may be used in a variety of devices. For example, such a piezoelectric device can be used to create a longitudinal wave pulse. By applying an electric field across the electrodes, the piezoelectric element will either contract or expand depending on the polarity of the applied electric field. If the piezoelectric element is caused to expand or contract at the proper rate, a sonic pulse or an ultra-sound pulse may be created. In the case where the longitudinal wave pulses are audible, the device may be used as a sound speaker. In the case where the longitudinal wave pulses are ultra-sonic, the device may be used in a fingerprint scanner.

A device made according to the invention can also, if the proper geometry has been utilized, be used as an actuator. Furthermore, if the electrodes of the piezoelectric element are coupled to a charge amplifier, the device may be used to detect pressure energy, such as in a sound or ultrasound field. Uses for this include force gages, pressure gages, and microphones.

A device made according to the invention may also be used as an accelerometer. To do so, a small seismic mass may be fixed to one of the electrodes, and the other electrode may be fixed to a rigid body.

Having described an embodiment of the invention, it will be recognized that the invention may be carried out so that a piezoelectric precursor material is applied to an assembly in order that the precursor material is positioned between a first electrode 16 and a second electrode 22. The precursor material is then subjected to a temperature above the Curie temperature, but below its melting temperature, and an electric field is applied to the precursor material in order to pole the crystals that are formed from the precursor material. The temperature is reduced to below the Curie temperature while the electric field is in place, and once the temperature is below the Curie temperature the electric field may be removed. The assembly comprising the electrodes and the precursor material may be fixed to an insulating base or insulating substrate 13. Application of the electrodes and precursor material may be accomplished using printing techniques, such as ink-jet printer, pen or screen.

Also, it will be recognized that in another embodiment of the invention, a piezoelectric precursor material is applied to a first electrode, and the precursor material is then subjected to a temperature above the Curie temperature, but below its melting temperature, and an electric field is applied to the precursor material in order to pole the crystals that are formed from the precursor material. The temperature is reduced to below the Curie temperature while the electric field is in place, and once the temperature is below the Curie temperature the electric field may be removed. Then a second electrode is applied to the piezoelectric material. The assembly comprising the electrodes and the precursor material may be fixed to an insulating base or insulating substrate. Application of the electrodes and precursor material may be accomplished using printing techniques, such as ink-jet printer, pen or screen.

Devices formed by using the invention may augment the inventory of sensing devices and actuating devices that are available to construct electric circuits. Piezoelectric devices that are formed according to the invention may be used in circuits for sensors (such as microphones), actuators, medical imaging, and non-destructive testing, and such circuits may be fabricated at a cost that is below that achieved by existing methods.

Piezoelectric devices formed according to the invention can be applied directly where the piezoelectric device is needed, thereby eliminating the need to form the piezoelectric device separately and then place the piezoelectric device into a circuit. Further, only as much material as is needed to form the piezoelectric device need be used, and thus a significant savings in material cost may be realized. Finally, it should be noted that using the invention it is possible to form a piezoelectric device on a curved surface, thereby facilitating more efficient use of available space.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A method of making a piezoelectric device, comprising:
    forming a coating material having piezoelectric precursor;
    applying the coating material to a first electrode;
    applying a second electrode to the precursor;
    heating the precursor to a temperature that is above the Curie temperature of the precursor, but below the melting temperature of the precursor;
    applying a voltage across the precursor; and
    reducing the temperature to below the Curie temperature while the voltage is applied.

2. The method of claim 1, wherein the coating material includes a liquid carrier.

3. The method of claim 2, wherein the carrier is a ketone solvent.

4. The method of claim 2, wherein the carrier includes water.

5. The method of claim 1, wherein the coating material is a solution.

6. The method of claim 1, wherein the coating material is a dispersion.

7. The method of claim 1, wherein the piezoelectric precursor is a polymer material.

8. The method of claim 7, wherein the polymer material is PVDF.

9. The method of claim 1, wherein the piezoelectric precursor is a co-polymer material.

10. The method of claim 9, wherein the co-polymer material is PVDF-TrFE.

11. The method of claim 1, wherein the precursor is a ceramic material.

12. The method of claim 11, wherein the ceramic material is lead zirconium titanate.

13. The method of claim 1, wherein the coating material is formed to a desired viscosity.

14. The method of claim 1, wherein the coating material includes color bodies.

15. The method of claim 1, wherein the coating material includes an adhesion promoting agent.

16. The method of claim 1, wherein applying the second electrode occurs prior to heating the precursor material to above the Curie temperature.

17. The method of claim 1, wherein applying the second electrode occurs after heating the precursor material to above the Curie temperature.

18. The method of claim 1, wherein the voltage is applied via the first and second electrodes.

19. The method of claim 1, wherein the voltage is applied by establishing a corona field.

20. The method of claim 1, wherein applying the coating material is accomplished by spraying the coating material.

21. The method of claim 1, wherein applying the coating material is accomplished by using a pen.

22. The method of claim 1, wherein applying the coating material is accomplished by using a screen.

* * * * *